United States Patent [19]
Jeong

[11] Patent Number: 6,066,556
[45] Date of Patent: May 23, 2000

[54] METHODS OF FABRICATING CONDUCTIVE LINES IN INTEGRATED CIRCUITS USING INSULATING SIDEWALL SPACERS AND CONDUCTIVE LINES SO FABRICATED

[75] Inventor: Gi-Tae Jeong, Kyunggi-do, Rep. of Korea

[73] Assignee: Samsung Electronics Co., Ltd., Rep. of Korea

[21] Appl. No.: 09/184,918

[22] Filed: Nov. 2, 1998

[30] Foreign Application Priority Data

Dec. 23, 1997 [KR] Rep. of Korea .................. 97-72781

[51] Int. Cl.$^7$ ..................................................... H01L 21/28
[52] U.S. Cl. ............................................. 438/639; 438/666
[58] Field of Search .................................. 438/629, 639, 438/666, FOR 355

[56] References Cited

U.S. PATENT DOCUMENTS 5,595,937   1/1997   Mikagi .
5,686,354  11/1997   Avanzino et al. .
5,795,823   8/1988   Avanzino et al. .

*Primary Examiner*—George Fourson
*Assistant Examiner*—Joannie A. Garcia
*Attorney, Agent, or Firm*—Myers Bigel Sibley & Sajovec

[57] ABSTRACT

Conductive lines are fabricated in integrated circuits by forming a groove in an insulating layer in the integrated circuit, wherein the groove has a sidewall, a base, and an upper surface. An insulating spacer is formed on the sidewall of the groove. The insulating spacer has a sloped contour from the sidewall to the base of the groove, defining a region at the base of the groove that is free of the insulating spacer. A conductive material is formed in the groove extending from the base of the groove to beneath the upper surface of the groove. The sloped contour of the spacer may provide for improved capping of conductive lines by allowing an increase in the amount of conductive material removed by a back-etching process, thereby reducing the likelihood of an electrical short between conductive lines.

6 Claims, 4 Drawing Sheets

METHODS OF FABRICATING CONDUCTIVE LINES IN INTEGRATED CIRCUITS USING INSULATING SIDEWALL SPACERS AND CONDUCTIVE LINES SO FABRICATED

FIELD OF THE INVENTION

The present invention relates to the field of integrated circuits and fabrication methods thereof and more particularly to conductive lines for integrated circuits and fabrication methods therefor.

BACKGROUND OF THE INVENTION

Conductive lines are widely used for interconnections in integrated circuits. For example, conductive lines may be used to transmit data to and from a memory array within a Dynamic Random Access Memory (DRAM) integrated circuit. As the level of integration increases in integrated circuits so there may be a need to reduce the width of conductive lines such as bit lines. In particular, integrated circuits having a critical line width less than 0.3 µm may be limited in the degree of integration. Accordingly, untapped bit lines have been widely used to further increase the degree of integration.

FIG. 1A to FIG. 1C illustrate methods of fabricating bit lines according to the prior art. As shown in FIG. 1A, an interlevel insulating layer 12 is formed on a conductive layer 11. The interlevel insulating layer 12 is etched to form a bit line contact hole 13. The bit line contact hole 13 is formed in the interlevel insulating layer 12 so as to expose a portion of the conductive layer 11.

As shown in FIG. 1B, a conductive material 14 is formed on the interlevel insulating layer 12, on the conductive layer 11 and in the bit line contact hole 13. A photoresist pattern 15 is then formed to provide patterning for the conductive material 14. The photoresist pattern 15 provides a window 16 that is about the same size as the bit line contact hole 13 so as to avoid the formation of taps on the bit line. However, a mask misalignment 15A may cause overetching of the conductive material 14 within the contact hole 16 and thereby increase the bit line resistance.

As shown in FIG. 1C, the portion of the conductive material 14 that lies outside the window 16 is removed via an etching process.

FIG. 2A to FIG. 2C illustrate methods of fabricating a bit line using a damascene process to address the problems associated with the above described mask misalignment according to the prior art.

As shown in FIG. 2A, an interlevel insulating layer 22 is formed on a conductive layer 21. The interlevel insulating layer 22 is etched to form a bit line contact hole 23. The bit line contact hole 23 exposes the conductive layer 21.

As shown in FIG. 2B, a conductive material 24 is formed on the interlevel insulating layer 22, on the conductive material 21 and in the bit line contact hole 23.

As shown in FIG. 2C, the bit line 24 is formed by a Chemical Mechanical Polishing (CMP) method. Accordingly, the portion of the conductive material 24 on the interlevel insulating layer 22 is removed. Finally, a capping layer may be formed on the interlevel insulating layer 22 and the bit line 24. In particular, a nitride layer may be used to cap the bit line by capping both the sidewalls and the top of the bit line using a self-aligned contact process so as to prevent a short between storage node contacts. It may however be difficult to cap both the sidewalls and the top of the bit line using the damascene process according to the prior art.

SUMMARY OF THE INVENTION

It is an object of the present invention to provide improved conductive line fabrication methods for integrated circuits and conductive lines so fabricated.

It is another object of the present invention to provide improved capping of conductive lines in integrated circuits and capped conductive lines.

These and other objects of the present invention are provided by a method of fabricating conductive lines wherein insulating spacers that have sloped contours allow an increase in the amount of conductive material that may be removed in a back-etching process, thereby reducing the likelihood of an electrical short between conductive lines. In particular, an insulating layer is formed in the integrated circuit, the insulating layer includes a groove having a sidewall, a base, and an upper surface. An insulating spacer is formed on the sidewall of the groove, the insulating spacer having a sloped contour from the sidewall at the upper surface of the groove to the base of the groove, defining a region at the base of the groove that is free of the insulating spacer. A conductive material is formed in the groove extending from the base of the groove to beneath the upper surface of the groove. According to the prior art, a damascene process may be used to fabricate a conductive line positioned at the same level as the upper surface of the groove, thereby making it more difficult to form the capping layer.

In another aspect of the present invention, a conductive layer is formed beneath the insulating layer. The insulating region at the base of the groove, that is free of the insulating spacer, is etched to expose the conductive layer. The conductive material is formed to extend from the exposed conductive layer through the insulating spacer to beneath the upper surface of the groove.

The present invention also provides a conductive line that includes an insulating layer in the integrated circuit including a groove that has a sidewall, a base, and an upper surface. An insulating spacer on the sidewall of the groove has a sloped contour from the sidewall at the upper surface of the groove to the base of the groove, defining a region at the base of the groove that is free of the insulating spacers. Conductive material is positioned in the groove extending from the base of the groove to beneath the upper surface of the groove.

Detailed Description of Preferred Embodiments

Figure 1A:
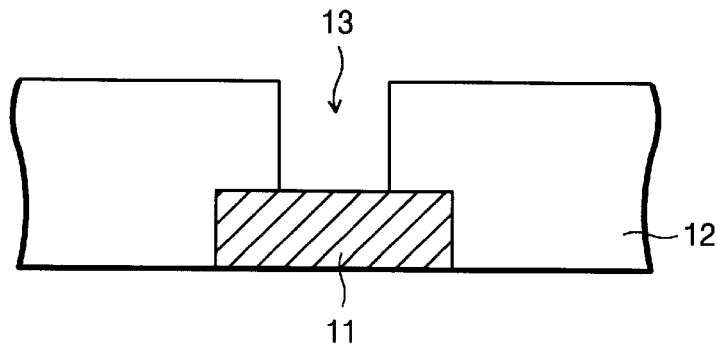
FIG. 1A to FIG. 1C are enlarged cross-sectional views illustrating methods of fabricating a bit line according to the prior art.
Figure 1B:
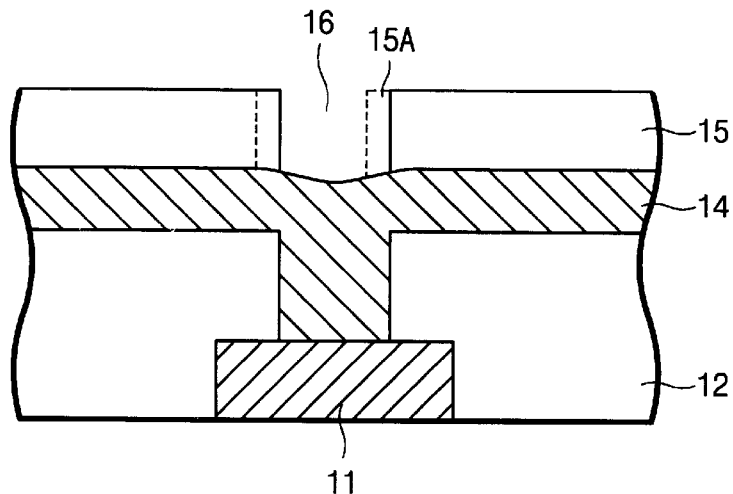
Figure 1C:
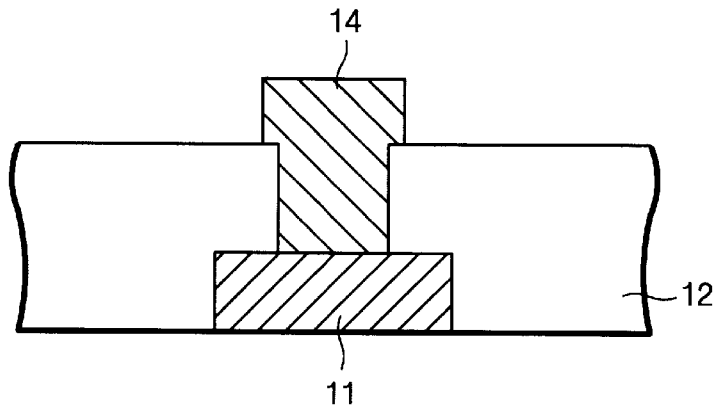
Figure 2A:
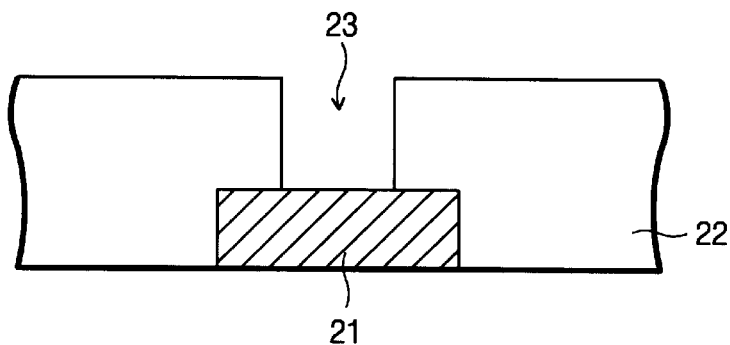
FIG. 2A to FIG. 2C are enlarged cross-sectional views illustrating methods of fabricating a bit line using a damascene process according to the prior art.
Figure 2B:
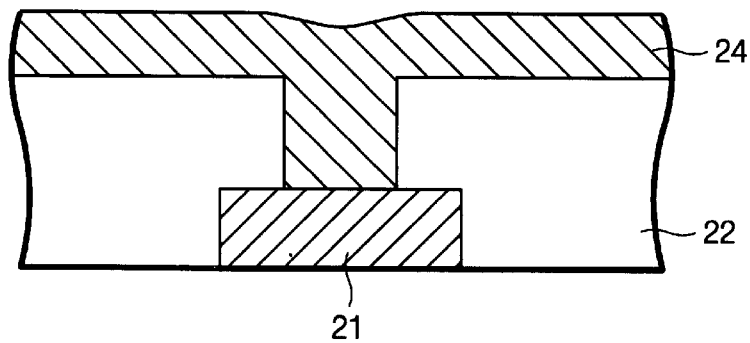
Figure 2C:
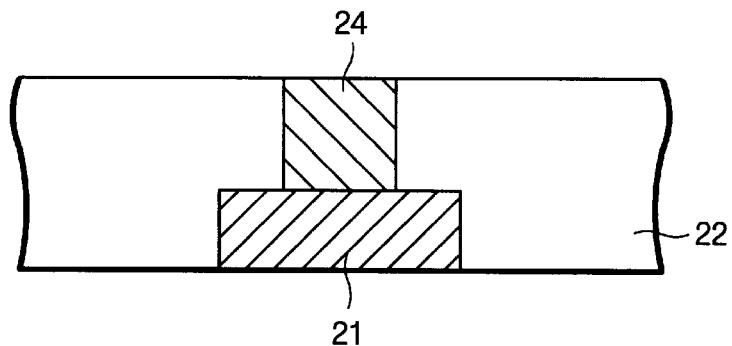

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 3A:
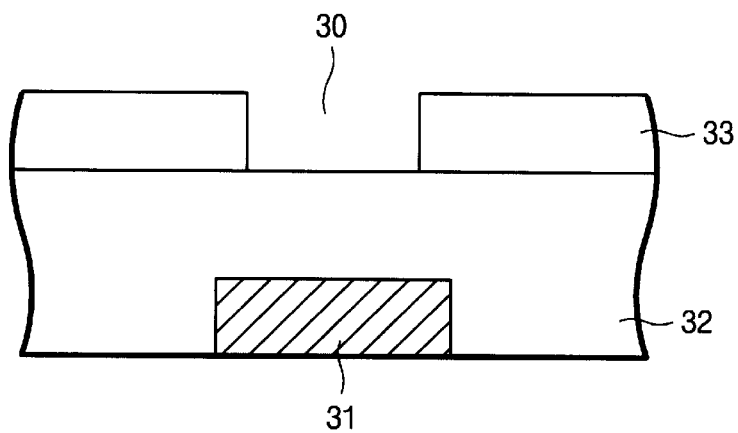
FIG. 3A to FIG. 3F are enlarged cross-sectional views illustrating methods of fabricating conductive lines according to the present invention and conductive lines so fabricated.

FIG. 3A to FIG. 3F are enlarged cross-sectional views illustrating methods of fabricating conductive lines according to the present invention and conductive lines so fabricated. Specifically, fabrication of bit lines will be illustrated. As shown in FIG. 3A, an insulating layer 32 is formed on a conductive layer 31. The conductive layer 31 is on an integrated circuit substrate. A first photoresist pattern 33 is formed on the insulating layer 32. The first photoresist pattern 33 includes a window 30 through which the insulating layer 32 is etched.

Figure 3B:
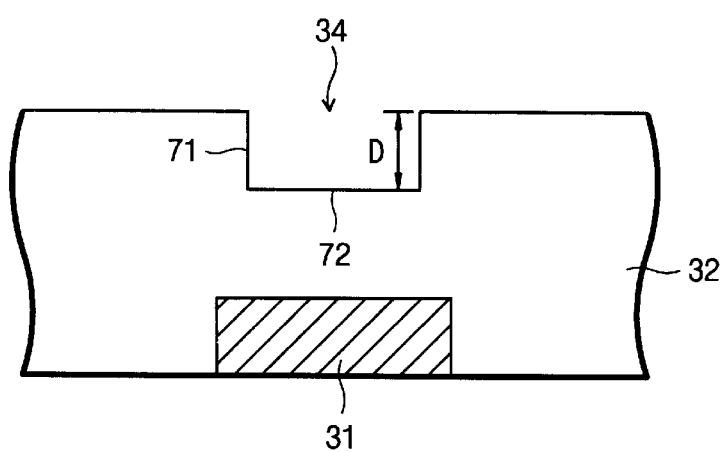

As shown in FIG. 3B, the insulating layer 32 is etched through the first photoresist pattern 33 to form a groove 34 having a depth D. The depth D may be about equal to the sum of the thickness of the bit line and the thickness of a capping nitride layer included in the capping layer formed on the bit line. The groove 34 includes an upper surface, a sidewall 71, and a base 72.

Figure 3C:
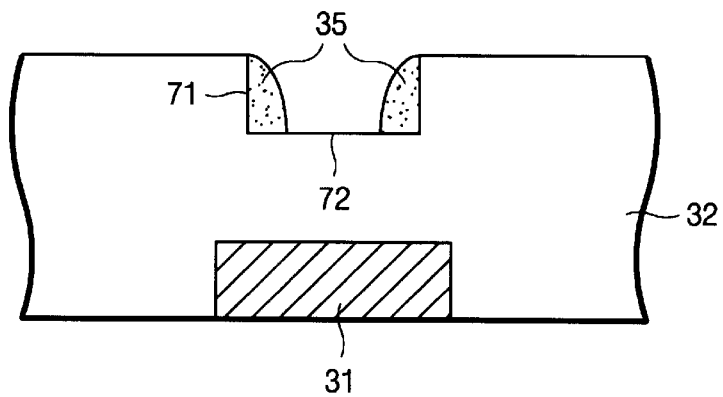

As shown in FIG. 3C, a nitride layer is deposited on the insulating layer 32 and in the groove 34. The nitride layer is etched to form insulating spacers 35 on the sidewall 71 and on a portion of the base 72 of the groove 34. The insulating spacers 35 are provided to cap the sidewalls of the bit line. The insulating spacers 35 have a sloped contour from the respective sidewall 71 at the upper surface of the groove to the base 72 of the groove. The insulating spacers 35 define a region at the base 72 of the groove 34 that is free of the insulating spacers 35.

Figure 3D:
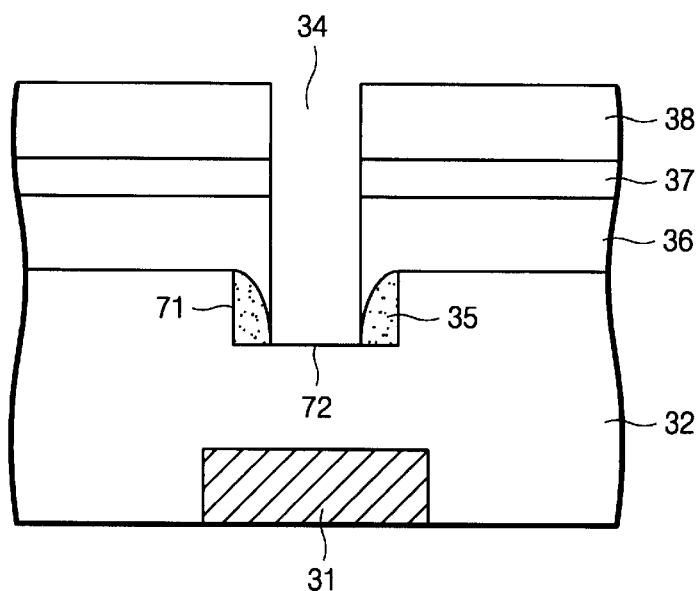

As shown in FIG. 3D, a second photoresist layer 36 is deposited on the insulating layer 32. An oxide layer 37 and a third photoresist layer 38 are then formed on the second photoresist layer 36. The third photoresist layer 38 is patterned using a mask (or a reticle) to form an opening therein. The opening has a size about equal to the size of the region at the base 72 of the groove 34 that is free of the insulating spacers 35. The oxide layer 37 and the second photoresist layer 36 are then sequentially etched using the patterned third photoresist layer 38 as a contact mask.

Figure 3E:
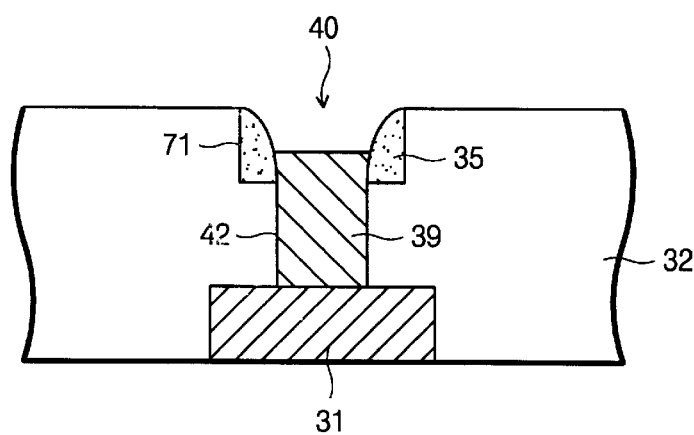

As shown in FIG. 3E, a contact hole 42 is etched in the insulating layer 32 using the contact mask. The contact mask is removed and a conductive layer 39 is formed on the insulating layer 32, filling the contact hole 42. The conductive layer 39 may comprise a material selected from at least one of polysilicon, silicide, and metal.

An etch-back process is used to remove the conductive layer 39 from the insulating layer 32. The etch-back process also removes a portion of the conductive layer 39 from the contact hole 42. As a result, a channel 40 is formed on the conductive layer 39 as shown in FIG. 3E. The conductive layer 39 beneath the channel 42 can be used as a bit line. The amount of the conductive material 39 removed by the etch-back process may be increased by the contoured slope of the insulating spacers 35, thereby allowing a decrease in the likelihood of an electrical short occurring between bit lines.

Figure 3F:
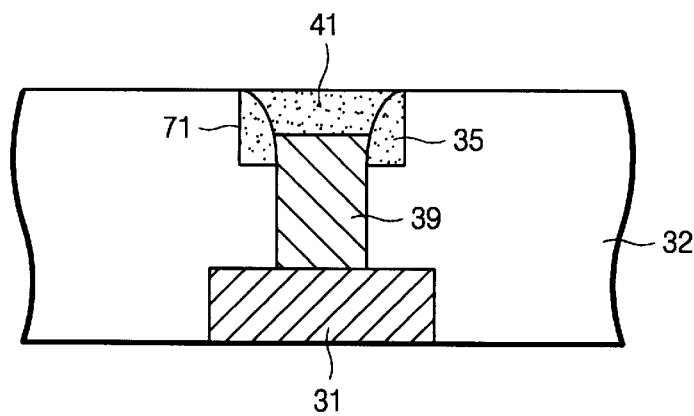

As shown in FIG. 3F, a nitride layer 41 is formed on the insulating layer 32, thereby filling the channel 42. A Chemical Mechanical Polishing (CMP) process may be used to remove the nitride layer 41 so as to expose the insulating layer 32. As a result, a capping layer is formed that includes the nitride spacers 35 and the nitride layer 41 formed in the channel 42. Thus, adequate capping of the top and sidewalls of the bit line is achieved despite a misalignment during the photomask process.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a conductive line in an integrated circuit comprising the steps of:

forming an insulating layer in the integrated circuit, the insulating layer including a groove having a sidewall, a base, and an upper surface;

forming an insulating spacer on the sidewall of the groove, the insulating spacer having a sloped contour from the sidewall at the upper surface of the groove to the base of the groove, defining a region at the base of the groove that is free of the insulating spacer;

forming conductive material in the groove extending beneath the upper surface of the groove; and forming an insulating capping layer on the conductive material to thereby form the conductive line that is recessed beneath the surface of the insulating layer.

2. The method of claim 1, further comprising the steps of:

forming a conductive layer beneath the insulating layer;

etching the insulating layer through the region at the base of the groove that is free of the insulating spacer to form a contact hole therein to expose the conductive layer; and forming the conductive material in the contact hole to extend from the exposed conductive layer through the insulating spacer to beneath the upper surface of the groove.

3. A method of forming a conductive line in an integrated circuit comprising the steps of:

forming an insulating layer in the integrated circuit, the insulating layer including a groove having a sidewall, a base, and an upper surface;

forming an insulating spacer on the sidewall of the groove, the insulating spacer having a sloped contour from the sidewall at the upper surface of the groove to the base of the groove, defining a region at the base of the groove that is free of the insulating spacer;

forming conductive material in the groove extending from the base of the groove to beneath the upper surface of the groove;

forming a conductive layer beneath the insulating layer;

forming a first photoresist layer on the insulating layer;

forming an oxide layer on the first photoresist layer;

forming a second photoresist layer on the oxide layer having an opening therein;

etching the oxide layer and the first photoresist layer using the second photoresist layer as an etch mask to form a contact mask;

etching the insulating layer using the contact mask, wherein the insulating spacer and the insulating layer have about the same etch selectivity; and forming the conductive material to extend from the exposed conductive layer through the insulating spacer to beneath the upper surface of the groove.

4. The method of claim 2, wherein the step of forming a conductive material in the contact hole comprises:

filling the contact hole with the conductive material; and removing a portion of the conductive material in the contact hole using a back-etch process.

5. A method of forming a conductive line in an integrated circuit comprising the steps of:

forming an insulating layer in the integrated circuit, the insulating layer including a groove having a sidewall, a base, and an upper surface;

forming an insulating spacer on the sidewall of the groove, the insulating spacer having a sloped contour from the sidewall at the upper surface of the groove to the base of the groove, defining a region at the base of the groove that is free of the insulating spacer;

forming a first photoresist layer on the insulating layer;

forming an oxide layer on the first photoresist layer;

forming a second photoresist layer on the oxide layer having an opening therein;

etching the oxide layer and the first photoresist layer using the second photoresist layer as an etch mask to form a contact mask;

etching the insulating layer using the contact mask, wherein the insulating spacer and the insulating layer have about the same etch selectivity; and forming conductive material in the groove extending to beneath the upper surface of the groove.

6. The method of claim 5, further comprising the steps of:

forming a conductive layer beneath the insulating layer;

etching the insulating layer through the region at the base of the groove that is free of the insulating spacer to form a contact hole therein to expose the conductive layer; and forming the conductive material in the contact hole to extend from the exposed conductive layer through the insulating spacer to beneath the upper surface of the groove.

* * * * *